United States Patent
Xiu (10) Patent No.: US 11,184,020 B2
(45) Date of Patent: Nov. 23, 2021

(54) INFORMATION REPRESENTATION METHOD, MULTI-VALUE CALCULATION CIRCUIT AND ELECTRONIC SYSTEM

(71) Applicant: BOE TECHNOLOGY GROUP CO., LTD., Beijing (CN)

(72) Inventor: Liming Xiu, Beijing (CN)

(73) Assignee: BOE TECHNOLOGY GROUP CO., LTD., Beijing (CN)

(\*) Notice: Subject to any disclaimer, the term of this patent is extended or adjusted under 35 U.S.C. 154(b) by 229 days.

(21) Appl. No.: 16/465,283

(22) PCT Filed: Nov. 13, 2018

(86) PCT No.: PCT/CN2018/115258
§ 371 (c)(1),
(2) Date: May 30, 2019

(87) PCT Pub. No.: WO2019/140993
PCT Pub. Date: Jul. 25, 2019

(65) Prior Publication Data
US 2021/0096817 A1    Apr. 1, 2021

(30) Foreign Application Priority Data
Jan. 17, 2018 (CN) .......................... 201810044849.7

(51) Int. Cl.
*H03M 5/20* (2006.01)
*G06F 7/50* (2006.01)
(Continued)

(52) U.S. Cl.
CPC ............... *H03M 5/20* (2013.01); *G06F 7/50* (2013.01); *H03M 5/22* (2013.01); *H04L 25/4917* (2013.01); *H03K 17/04* (2013.01)

(58) Field of Classification Search
None
See application file for complete search history.

(56) References Cited

U.S. PATENT DOCUMENTS 2,997,602 A * 8/1961 Eachus .................. H03K 3/286
327/190
3,618,043 A * 11/1971 Whiting .................. H04L 13/08
714/707
(Continued)

FOREIGN PATENT DOCUMENTS

| CN | 102043603 A | 5/2011 |
| CN | 102413086 A | 4/2012 |

(Continued)

OTHER PUBLICATIONS

Brezeanu et al., A Simple Technique To Increase The Switching Speed Of The MOS Transistor—Microelectronics, 1997. Proceedings., 1997 21st International Conference on.*

(Continued)

*Primary Examiner* — Berhanu Tadese
(74) *Attorney, Agent, or Firm* — Dilworth & Barrese, LLP.; Michael J. Musella, Esq.

(57) ABSTRACT

An information representation method, a multi-value calculation circuit and an electronic system are provided. The information representation method includes: acquiring a switching rate of a signal; and adopting the switching rate of the signal to represent information.

19 Claims, 5 Drawing Sheets

(51) Int. Cl.
  *H03M 5/22* (2006.01)
  *H04L 25/49* (2006.01)
  *H03K 17/04* (2006.01)

(56) References Cited

U.S. PATENT DOCUMENTS

| | | | | |
|---|---|---|---|---|
| 3,618,044 A * | 11/1971 | Cupp | H04L 25/49 | 711/100 |
| 3,623,078 A * | 11/1971 | Whiting | H04L 13/08 | 341/57 |
| 3,629,590 A * | 12/1971 | Case | H03K 17/795 | 250/551 |
| 3,629,823 A * | 12/1971 | Czernikowski | H04L 13/08 | 714/746 |
| 3,641,506 A * | 2/1972 | Cupp | H04L 13/08 | 713/400 |
| 3,646,531 A * | 2/1972 | Marahashi | G11C 11/06007 | 365/206 |
| 3,653,036 A * | 3/1972 | Whiting | H04L 25/4925 | 341/57 |
| 3,723,982 A * | 3/1973 | Frazier, Jr. | G11B 20/10194 | 360/18 |
| 3,813,560 A * | 5/1974 | Grant | H03K 17/603 | 327/379 |
| 3,940,567 A * | 2/1976 | Iki | G08C 15/12 | 370/522 |
| 4,092,553 A * | 5/1978 | Fang | G05F 3/02 | 326/3 |
| 4,103,234 A * | 7/1978 | Frazier, Jr. | G11B 20/10009 | 341/139 |
| 4,314,193 A * | 2/1982 | Mortonson | G01R 31/343 | 322/28 |
| 4,315,204 A * | 2/1982 | Sievers | H02J 7/1461 | 322/28 |
| 4,348,629 A * | 9/1982 | Sievers | G01R 31/343 | 322/99 |
| 4,379,990 A * | 4/1983 | Sievers | G01R 31/007 | 322/99 |
| 4,533,993 A * | 8/1985 | McCanny | G06F 7/5306 | 712/16 |
| 4,620,258 A * | 10/1986 | Bloomer | H03K 17/0828 | 361/91.2 |
| 4,631,428 A * | 12/1986 | Grimes | H03M 5/16 | 326/59 |
| 4,733,605 A * | 3/1988 | Holter | B01D 53/34 | 454/158 |
| 4,849,659 A * | 7/1989 | West | H03K 19/0826 | 326/56 |
| 4,947,063 A * | 8/1990 | O'Shaughnessy | H03K 17/163 | 326/103 |
| 5,003,360 A * | 3/1991 | Okada | B82Y 10/00 | 257/14 |
| 5,051,611 A * | 9/1991 | Kantz | H03K 3/2893 | 327/143 |
| 5,144,157 A * | 9/1992 | Russell | H03K 17/667 | 327/108 |
| 5,283,479 A * | 2/1994 | Rosseel | H03K 19/09448 | 326/104 |
| 5,285,202 A * | 2/1994 | Cooperman | H04Q 3/521 | 327/382 |
| 5,319,453 A * | 6/1994 | Copriviza | H04H 20/14 | 346/6 |
| 5,512,883 A | 4/1996 | Lane | | |
| 5,568,064 A * | 10/1996 | Beers | H04L 5/1423 | 326/31 |
| 5,764,667 A * | 6/1998 | Luque | H01S 5/0428 | 372/38.07 |
| 6,031,359 A * | 2/2000 | Michelsen | H02J 7/02 | 320/141 |
| 6,037,827 A * | 3/2000 | Fisch | H03K 17/165 | 326/27 |
| 6,169,389 B1 * | 1/2001 | Chen | H02J 7/345 | 320/166 |
| 6,229,336 B1 * | 5/2001 | Felton | H03K 17/163 | 326/38 |
| 6,255,847 B1 * | 7/2001 | Chan | H03K 17/163 | 326/41 |
| 7,283,594 B1 * | 10/2007 | Wood | H04L 25/4904 | 375/278 |
| 9,621,173 B1 * | 4/2017 | Xiu | H03L 7/0991 | |
| 9,659,721 B1 * | 5/2017 | Sastry | H01H 9/54 | |
| 9,769,003 B2 * | 9/2017 | Bogdan | H04L 27/2695 | |
| 9,840,161 B2 | 12/2017 | Chikkannanavar et al. | | |
| 10,686,458 B1 * | 6/2020 | Xiu | H03L 7/18 | |
| 2002/0000845 A1 * | 1/2002 | Lu | H04L 25/0276 | 327/108 |
| 2002/0008559 A1 * | 1/2002 | Krishnamurthy | H04L 25/028 | 327/206 |
| 2002/0080468 A1 * | 6/2002 | Crummey | H04L 25/26 | 359/325 |
| 2005/0226500 A1 * | 10/2005 | Sasaki | H04N 11/046 | 382/166 |
| 2005/0278661 A1 * | 12/2005 | Lablans | G06F 7/49 | 326/56 |
| 2006/0181246 A1 * | 8/2006 | Hackner | H02M 1/08 | 320/148 |
| 2006/0192541 A1 * | 8/2006 | Hackner | H02M 1/08 | 323/288 |
| 2006/0209577 A1 * | 9/2006 | Hackner | H02M 3/156 | 363/39 |
| 2006/0245239 A1 * | 11/2006 | Sumita | G11C 7/1006 | 365/154 |
| 2008/0007423 A1 | 1/2008 | Krueger et al. | | |
| 2008/0205486 A1 * | 8/2008 | Badets | H04B 1/7174 | 375/130 |
| 2009/0091991 A1 | 4/2009 | Cho et al. | | |
| 2011/0255360 A1 * | 10/2011 | Takahashi | G11C 11/406 | 365/219 |
| 2011/0285439 A1 * | 11/2011 | Xiu | G06F 1/025 | 327/159 |
| 2011/0286539 A1 * | 11/2011 | Kawai | H04L 5/06 | 375/259 |
| 2012/0307923 A1 * | 12/2012 | Bogdan | H04L 25/0398 | 375/260 |
| 2014/0340137 A1 * | 11/2014 | Keane | H03K 17/693 | 327/434 |
| 2015/0312078 A1 * | 10/2015 | Bogdan | H03L 7/00 | 375/226 |
| 2016/0299560 A1 | 10/2016 | Kondo | | |
| 2016/0315648 A1 * | 10/2016 | Talty | H04L 1/0071 | |
| 2016/0315654 A1 * | 10/2016 | Talty | H04B 1/0007 | |
| 2017/0040842 A1 * | 2/2017 | Morikawa | H02J 50/12 | |
| 2018/0033954 A1 * | 2/2018 | Aradhya | H01F 10/3272 | |
| 2018/0261632 A1 * | 9/2018 | Choi | H01L 27/1237 | |
| 2019/0123749 A1 * | 4/2019 | Xiu | H03L 7/18 | |
| 2019/0130138 A1 * | 5/2019 | Liu | G06K 7/087 | |
| 2019/0261472 A1 * | 8/2019 | Xiu | H03K 3/017 | |
| 2019/0361484 A1 * | 11/2019 | Xiu | H03L 7/0991 | |
| 2019/0363307 A1 * | 11/2019 | Cheng | H01L 51/56 | |
| 2020/0280313 A1 * | 9/2020 | Rinne | H02M 3/33576 | |
| 2021/0075426 A1 * | 3/2021 | Wei | H03L 7/0996 | |

FOREIGN PATENT DOCUMENTS

| | | | | |
|---|---|---|---|---|
| CN | 102413086 A | * | 4/2012 | |
| CN | 102413086 B | * | 11/2013 | |
| CN | 104954026 A | | 9/2015 | |
| CN | 105119690 A | | 12/2015 | |
| CN | 105739944 A | | 7/2016 | |
| CN | 205753473 U | * | 11/2016 | H02J 7/0063 |
| CN | 205753473 U | | 11/2016 | |
| CN | 106664098 A | | 5/2017 | |
| CN | 107176038 A | * | 9/2017 | B60L 58/12 |
| CN | 107176038 A | | 9/2017 | |

(56) References Cited

FOREIGN PATENT DOCUMENTS

JP         H08147144 A    6/1996
WO       0246499 A1    6/2002

OTHER PUBLICATIONS

CN 102413086—(Chinese Language).*
CN 102413086—(Google Translated).*
G. A. Kouzaev, Igor V. Nazarov, Andrew V. Kalita : Unconventional Logic Elements on the Base of Topologically Modulated Signals ; Laser and Microwave Information Systems Dept., Moscow State Institute of Electronics and Mathematics, Nov. 1999. (Year: 1999).*
"Basic structure of quadrilateral computer system hardware" cited in the book Multivalued logic circuits with neural networks and fuzzy computers, Published on Mar. 31, 2002 ,Shukai Chen, p. 160-163.
First Chinese Office Action dated Dec. 9, 2019.
International Search Report and Written Opinion dated Jan. 25, 2019 from State Intellectual Property Office of the P.R. China.
Supplementary European Search Report from EP Application No. 18882266.2 dated Sep. 14, 2021.

* cited by examiner

INFORMATION REPRESENTATION METHOD, MULTI-VALUE CALCULATION CIRCUIT AND ELECTRONIC SYSTEM

CROSS-REFERENCE TO RELATED APPLICATION

The present application claims priority of Chinese Patent Application No. 201810044849.7, filed on Jan. 17, 2018, the disclosure of which is incorporated herein by reference in its entirety as part of the present application.

TECHNICAL FIELD

The embodiments of the present disclosure relate to an information representation method, a multi-value calculation circuit and an electronic system.

BACKGROUND

The characteristics of the fourth industrial revolution include information, interconnection and intelligence, the fourth industrial revolution is aimed at achieving the interconnection of all things and the intelligence of life. Interconnection and intelligence are all developed around information. For interconnection, a defined object of the interconnection is information (for example, the Internet refers to the interconnection of information, does not refer to direct contact between machines). For intelligence, the intelligent control of all things is achieved through information. Information in the traditional sense refers to speech, words, peak fire, sign language, semaphore, drum sounds, etc. In the fourth industrial revolution, information refers to the data stream that flows in the electronic world. In the electronic age, data-streamed electronic information has new temporal and spatial characteristics, and not only can be transmitted in real time over long distances but also can be stored and restored without loss.

SUMMARY

An embodiment of the present disclosure provides an information representation method of an electronic system, comprising: acquiring a switching rate of a signal; and adopting the switching rate of the signal to represent information.

For example, in the information representation method provided by an embodiment of the present disclosure, the information is represented as a switching-rate bit, a value range of the switching-rate bit comprises N switching-rate states, and N is a positive integer and N>1.

For example, in the information representation method provided by an embodiment of the present disclosure, a value of the information is equal to a value of the switching-rate bit and represents one of the N switching-rate states.

For example, in the information representation method provided by an embodiment of the present disclosure, the value of the switching-rate bit is an N-ary number.

For example, in the information representation method provided by an embodiment of the present disclosure, the value of the switching-rate bit is a number of times of the signal crossing a threshold within a fixed time window.

For example, in the information representation method provided by an embodiment of the present disclosure, the signal is a voltage signal, the threshold is a threshold voltage, and adopting the switching rate of the signal to represent the information comprises: adopting a number of times of the voltage signal crossing the threshold voltage within the fixed time window to represent the value of the information.

For example, in the information representation method provided by an embodiment of the present disclosure, the threshold voltage has a selected voltage value.

For example, in the information representation method provided by an embodiment of the present disclosure, the signal is a current signal, the threshold is a threshold current, and adopting the switching rate of the signal to represent the information comprises: adopting a number of times of the current signal crossing the threshold current within the fixed time window to represent the value of the information.

For example, in the information representation method provided by an embodiment of the present disclosure, the threshold current has a selected current value.

For example, in the information representation method provided by an embodiment of the present disclosure, the value of the switching-rate bit is one of a number of times of the signal entering a threshold range within a fixed time window, a number of times of the signal leaving the threshold range within the fixed time window, and a sum of the number of times of the signal entering the threshold range within the fixed time window and the number of times of the signal leaving the threshold range within the fixed time window.

For example, in the information representation method provided by an embodiment of the present disclosure, the signal is a voltage signal, the threshold range is a threshold voltage range, and adopting the switching rate of the signal to represent the information comprises: adopting the number of times of the voltage signal entering and/or leaving the threshold voltage range within the fixed time window to represent the value of the information.

For example, in the information representation method provided by an embodiment of the present disclosure, the signal is a current signal, the threshold range is a threshold current range, and adopting the switching rate of the signal to represent the information comprises: adopting the number of times of the current signal entering and/or leaving the threshold current range within the fixed time window to represent the value of the information.

For example, in the information representation method provided by an embodiment of the present disclosure, the switching rate of the signal represents a speed at which the signal changes within a fixed time window.

For example, in the information representation method provided by an embodiment of the present disclosure, the switching rate of the signal is relevant to a reverse speed of transistors in the electronic system.

An embodiment of the present disclosure further provides a multi-value calculation circuit, comprising: a first system conversion circuit configured to: receive an input signal, an amplitude of the input signal being used to represent first information, and convert the input signal into a first multi-value signal, a switching rate of the first multi-value signal being used to represent the first information; a multi-value logical operation circuit configured to: receive the first multi-value signal from the first system conversion circuit, and perform a multi-value logical operation according to the first multi-value signal, and output a second multi-value signal as a result of the multi-value logical operation, a switching rate of the second multi-value signal being used to represent second information; and a second system conversion circuit configured to: receive the second multi-value signal from the multi-value logical operation circuit, and convert the second multi-value signal into an output signal, an amplitude of the output signal being used to represent the second information.

For example, in the multi-value calculation circuit provided by an embodiment of the present disclosure, both the input signal and the output signal are binary data signals.

For example, in the multi-value calculation circuit provided by an embodiment of the present disclosure, the first information comprises input information of the multi-value calculation circuit, and the second information comprises output information of the multi-value calculation circuit.

For example, in the multi-value calculation circuit provided by an embodiment of the present disclosure, both the first information and the second information are represented as a switching-rate bit, a value range of the switching-rate bit comprises N switching-rate states, and N is a positive integer and N>1.

For example, in the multi-value calculation circuit provided by an embodiment of the present disclosure, a value of the first information and a value of the second information are respectively a first numerical value and a second numerical value of the switching-rate bit, the first numerical value of the switching-rate bit represents one state among the N switching-rate states, and the second numerical value also represents one state among the N switching-rate states.

For example, in the multi-value calculation circuit provided by an embodiment of the present disclosure, the first numerical value of the switching-rate bit is an N-ary number, and the second numerical value of the switching-rate bit is also an N-ary number.

For example, in the multi-value calculation circuit provided by an embodiment of the present disclosure, the first numerical value of the switching-rate bit is a number of times of the first multi-value signal crossing a threshold within a fixed time window, and the second numerical value of the switching-rate bit is a number of times of the second multi-value signal crossing the threshold within the fixed time window.

For example, in the multi-value calculation circuit provided by an embodiment of the present disclosure, the first multi-value signal and the second multi-value signal are respectively a first voltage signal and a second voltage signal, the threshold is a threshold voltage, a value of the first information is a number of times of the first voltage signal crossing the threshold voltage within the fixed time window, and a value of the second information is a number of times of the second voltage signal crossing the threshold voltage within the fixed time window; or the first multi-value signal and the second multi-value signal are respectively a first current signal and a second current signal, the threshold is a threshold current, a value of the first information is a number of times of the first current signal crossing the threshold current within the fixed time window, and a value of the second information is a number of times of the second current signal crossing the threshold current within the fixed time window.

For example, in the multi-value calculation circuit provided by an embodiment of the present disclosure, the first numerical value of the switching-rate bit is one of a number of times of the first multi-value signal entering a threshold range within a fixed time window, a number of times of the first multi-value signal leaving the threshold range within the fixed time window, and a sum of the number of times of the first multi-value signal entering the threshold range within the fixed time window and the number of times of the first multi-value signal leaving the threshold range within the fixed time window; and the second numerical value of the switching-rate bit is one of a number of times of the second multi-value signal entering the threshold range within the fixed time window, a number of times of the second multi-value signal leaving the threshold range within the fixed time window, and a sum of the number of times of the second multi-value signal entering the threshold range within the fixed time window and the number of times of the second multi-value signal leaving the threshold range within the fixed time window.

For example, in the multi-value calculation circuit provided by an embodiment of the present disclosure, the first multi-value signal and the second multi-value signal are respectively a first voltage signal and a second voltage signal, the threshold range is a threshold voltage range, the value of the first information is one of a number of times of the first voltage signal entering the threshold voltage range within the fixed time window, a number of times of the first voltage signal leaving the threshold voltage range within the fixed time window, and a sum of the number of times of the first voltage signal entering the threshold voltage range within the fixed time window and the number of times of the first voltage signal leaving the threshold voltage range within the fixed time window; and the value of the second information is one of a number of times of the second voltage signal entering the threshold voltage range within the fixed time window, a number of times of the second voltage signal leaving the threshold voltage range within the fixed time window, and a sum of the number of times of the second voltage signal entering the threshold voltage range within the fixed time window and the number of times of the second voltage signal leaving the threshold voltage range within the fixed time window; or the first multi-value signal and the second multi-value signal are respectively a first current signal and a second current signal, the threshold range is a threshold current range; the value of the first information is one of a number of times of the first current signal entering the threshold current range within the fixed time window, the number of times of the first current signal leaving the threshold current range within the fixed time window, and a sum of the number of times of the first current signal entering the threshold current range within the fixed time window and the number of times of the first current signal leaving the threshold current range within the fixed time window; and the value of the second information is one of a number of times of the second current signal entering the threshold current range within the fixed time window, the number of times of the second current signal leaving the threshold current range within the fixed time window, and a sum of the number of times of the second current signal entering the threshold current range within the fixed time window and the number of times of the second current signal leaving the threshold current range within the fixed time window.

An embodiment of the present disclosure further provides an electronic system, comprising the multi-value calculation circuit according to any one of the above embodiments.

For example, the electronic system provided by an embodiment of the present disclosure further comprises: one or more data input modes configured to provide the input signal; and one or more data receiving modes configured to receive the output signal.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure, and those skilled in the art can obtain other drawing(s) according to these drawings, without any inventive work

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Moore's Law refers to a phenomenon that when a price is constant, the number of components that can be accommodated on an integrated circuit chip is doubled every 18-24 months. Moore's Law contains both a spatial factor and a temporal factor. For example, the spatial factor of Moore's Law indicates that the semiconductor process takes the gradual reduction of the minimum line width as the generational progressive sign. When the line width becomes small, a turnover speed of a transistor becomes faster, so that the event occurs faster in the electronic world, and the efficiency of expressing information becomes higher. This is reflected in the generation-by-generation improvement of the operating frequency of electronic devices.

As the circuit density on a silicon chip increases, the complexity of the circuit will increase exponentially. At the same time, an increase in the square law of the number of transistors leads to an exponential increase in the manufacturing error rate. This makes thorough chip testing almost impossible. When the line width on the chip reaches the order of nanometers, the line width is equivalent to the size of only a few molecules. In this case, the physical and chemical properties of the material may change qualitatively, resulting in that the device cannot operate normally. From the perspective of the operation of the chip, there are also two major problems. The first problem is a dramatic increase in power consumption. The power consumption of large complex chips can reach hundreds of watts. When the line width of the transistor is reduced, although a switching speed of the transistor is getting faster and faster, switching performance of the transistor becomes worse and worse, and there is a considerable current in the "off" state, that is, leakage phenomenon. Although the fin transistor structure can ameliorate this situation to some extent, it also has its potential limit. The second problem is the high temperature brought about by high power consumption. High temperature will cause the circuits in the chip to not work properly. The two problems of power consumption and temperature will become more and more severe under the trend that the degree of circuit integration continues to increase. These facts show that there is no great potential to continue to explore Moore's Law in the spatial direction marked by the reduction of line width.

During a development process of integrated circuits, no matter analog circuit technology or digital circuit technology, information has always been expressed by the amount of charges (high and low voltage amplitude). In this way of expression, the fidelity of information is affected by at least two factors. The first factor is the amplitude of the supply voltage. The second factor is background noise. In the process of semiconductor technology development, while reducing the line width to increase speed, in order to reduce power consumption, the supply voltage has been reduced from generation to generation. However, the level of background noise has not been decreased. Therefore, using voltage amplitude to represent information needs to solve more and more difficulties. On the other hand, the direct effect of transistor line width reduction is that the turnover speed of the transistor becomes faster. Based on the development trend of the above semiconductor process, the embodiment of the present disclosure utilizes the turnover speed of the transistor to express information. For example, within a fixed time window, the number of times of a voltage waveform crossing a threshold can be used to represent information.

The information representation method and the multi-value calculation circuit provided by the embodiments of the present disclosure are compatible with the development trend of the semiconductor process. The smaller the semiconductor line width becomes, the faster the turnover speed of the transistors becomes, and the more efficient the information representation method and the multi-value calculation circuit provided by the embodiments of the present disclosure become. Therefore, the information representation method, the multi-value calculation circuit and the electronic system provided by the embodiments of the present disclosure can effectively reduce the power consumption while increasing the computational efficiency.

In the information representation method, the multi-value calculation circuit and the electronic system provided by the embodiments of the present disclosure, an amplitude of a signal representing information can be greatly reduced, which helps to greatly reduce the power consumption. Due to the use of multi-ary system, one switching-rate bit may contain a plurality of states, making it possible to directly adopt multi-ary system to perform operations in a computer, thereby greatly improving the computational efficiency of the computer.

Figure 1:
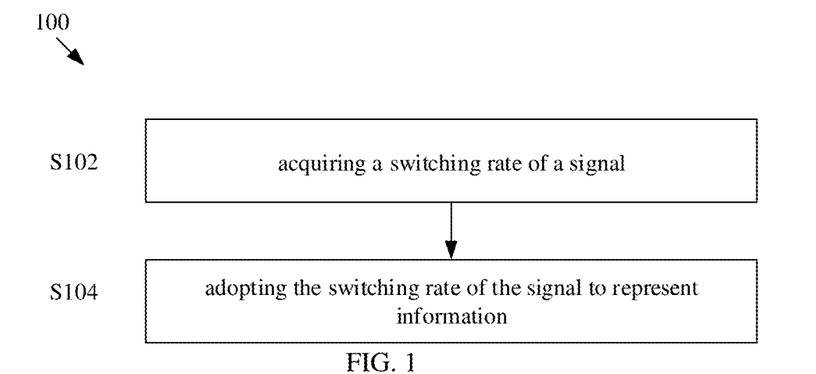
FIG. 1 is a flowchart of an information representation method provided by the embodiment of the present disclosure.

FIG. 1 is a flowchart of an information representation method provided by the embodiment of the present disclosure. As shown in FIG. 1, an embodiment of the present disclosure provides an information representation method 100 of an electronic system. The information representation method 100 comprises, but is not limited to:

S102: acquiring a switching rate of a signal; and

S104: adopting the switching rate of the signal to represent information.

In a traditional system, the most basic unit of information is bit. One bit can only be in one of a high state or a low state in one clock cycle. In some embodiments of the present disclosure, the information is represented as a switching-rate bit, a value range of the switching-rate bit includes N switching-rate states, and N is a positive integer and N>1. A value of the information is equal to a value of the switching-rate bit, and represents one of the N switching-rate states. The value of the switching-rate bit is an N-ary number. For instance, the information may be represented as a multi-value switching-rate bit, e.g., an N-ary switching-rate bit. The value range of the N-ary switching-rate bit includes a total of N values or states of 0, 1, 2 ... N−1 (or 1, 2 ... N−1, N), and the value of the information at a certain moment may be one of the N values or the N states.

For instance, in some embodiments, the value of the switching-rate bit is a number of times of the signal crossing a threshold within a fixed time window. A length of the fixed time window may be determined in advance according to the data processing capability of the electronic system or determined by the user. The present disclosure is not limited thereto.

For instance, the signal is a voltage signal, the threshold is a threshold voltage; and in the step S104, adopting the switching rate of the signal to represent the information includes: adopting a number of times of the voltage signal crossing the threshold voltage within the fixed time window to represent the value of the information. The threshold voltage has a selected voltage value, for instance, 0.5 V or other predetermined voltage values.

Figure 3A:
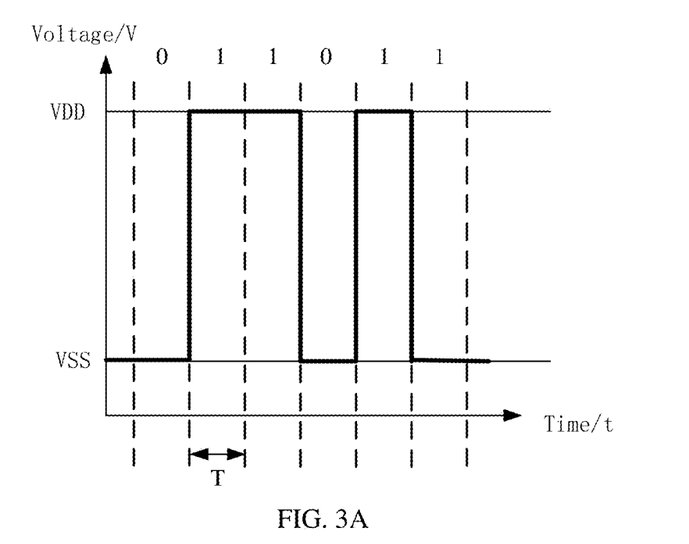
FIG. 3A shows an example of adopting a quantity of electric charges (namely amplitude) to represent information.
Figure 3B:
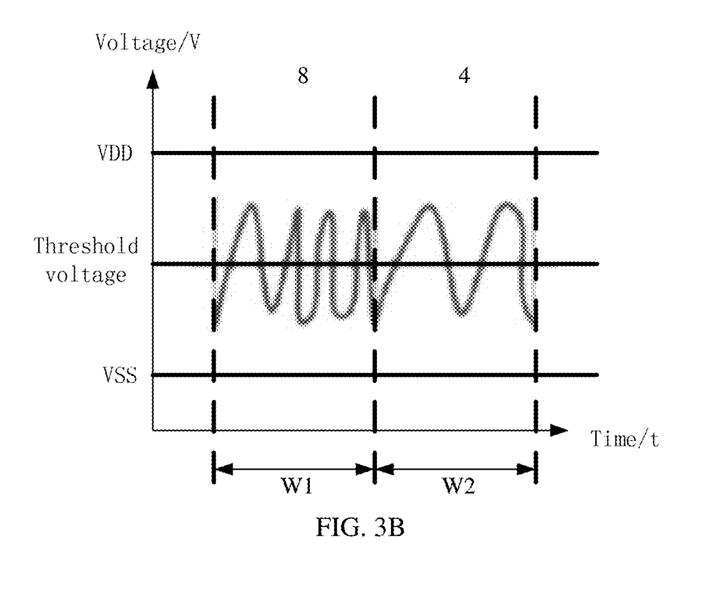
FIG. 3B shows an example of adopting a multi-value switching rate to represent information provided by an embodiment of the present disclosure.
Figure 3C:
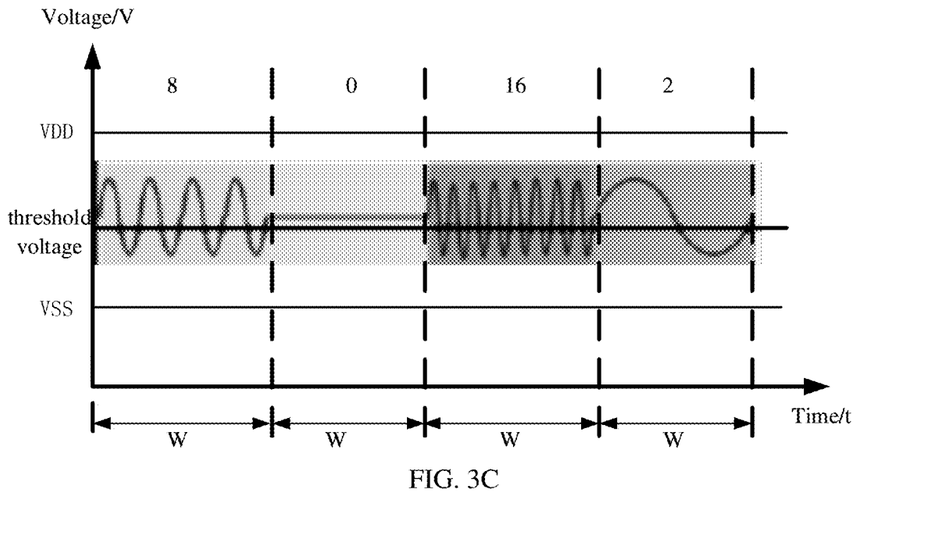
FIG. 3C shows another example of adopting a multi-value switching rate to represent information provided by an embodiment of the present disclosure.

FIG. 3B shows an example of adopting a multi-value switching rate to represent information provided by an embodiment of the present disclosure. FIG. 3C shows another example of adopting a multi-value switching rate to represent information provided by an embodiment of the present disclosure.

For instance, referring to FIG. 3B, in a first time window W1, the number of times of the voltage signal crossing the threshold voltage is 8, and therefore the value of the information is 8; and in a second time window W2, the number of times of the voltage signal crossing the threshold voltage is 4, and therefore the value of the information is 4. Both the first time window W1 and the second time window W2 have equal time span. Moreover, for instance, referring to FIG. 3C, the numbers of times of the voltage signal crossing the threshold voltage in various time windows W are respectively 8, 0, 16 and 2, and therefore the values of the information in various time windows W are respectively 8, 0, 16 and 2.

Moreover, for instance, the signal is a current signal, the threshold is a threshold current; and in the step S104, adopting the switching rate of the signal to represent the information includes: adopting a number of times of the current signal crossing the threshold current within the fixed time window to represent the value of the information. The threshold current has a selected current value, e.g., 0.1 uA or other current values.

For instance, in some embodiments, the value of the switching-rate bit is one of a number of times of the signal entering a threshold range within the fixed time window, a number of times of the signal leaving the threshold range within the fixed time window, and a sum of the number of times of the signal entering the threshold range within the fixed time window and the number of times of the signal leaving the threshold range within the fixed time window.

For instance, the signal is a voltage signal, the threshold range is a threshold voltage range; and in the step S104, adopting the switching rate of the signal to represent the information includes: adopting the number of times of the voltage signal entering and/or leaving the threshold voltage range within the fixed time window to represent the value of the information. For instance, the value of the information is equal to the number of times of the voltage signal entering the threshold voltage range within the fixed time window, or equal to the number of times of the voltage signal leaving the threshold voltage range within the fixed time window, or equal to the sum of the number of times of the voltage signal entering the threshold voltage range in the fixed time window and the number of times of the voltage signal leaving the threshold voltage range in the fixed time window.

Figure 3D:
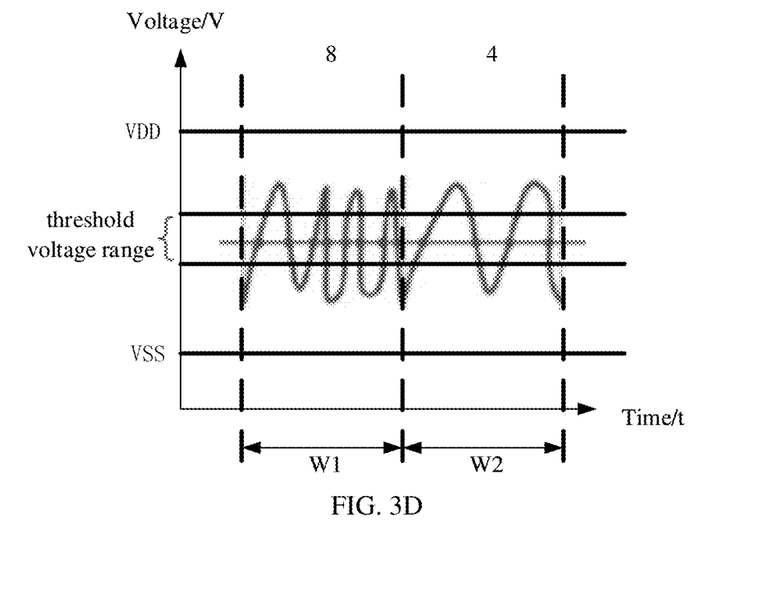
FIG. 3D shows still another example of adopting a multi-value switching rate to represent information provided by an embodiment of the present disclosure.

FIG. 3D shows still another example of adopting a multi-value switching rate to represent information provided by an embodiment of the present disclosure. For instance, referring to FIG. 3D, in the first time window W1, the number of times of the voltage signal entering the threshold voltage range is 8, so the value of the information is 8; and in the second time window W2, the number of times of the voltage signal entering the threshold voltage range is 4, so the value of the information is 4. Both the first time window W1 and the second time window W2 have equal time span. Or referring to FIG. 3D, in the first time window W1 and the second time window W2, the numbers of times of the voltage signal leaving the threshold voltage range are respectively 8 and 4, so the values of the information are respectively 8 and 4. Or referring to FIG. 3D, in the first time window W1 and the second time window W2, the sum of the numbers of times of the voltage signal entering the threshold voltage range and the numbers of times of the voltage signal leaving the threshold voltage range is simultaneously calculated, so the value of the information is respectively 8+8=16 and 4+4=8.

Moreover, for instance, the signal is a current signal, the threshold range is a threshold current range; and in the step S104, adopting the switching rate of the signal to represent the information includes: adopting the number of times of the current signal entering the threshold current range within the fixed time window and/or the number of times of the current signal leaving the threshold current range within the fixed time window to represent the value of the information. For instance, the value of the information is equal to the number of times of the current signal entering the threshold current range within the fixed time window, or equal to the number of times of the current signal leaving the threshold current range within the fixed time window, or equal to the sum of the number of times of the current signal entering the threshold current range within the fixed time window and the number of times of the current signal leaving the threshold current range within the fixed time window.

For instance, the switching rate of the signal represents a speed at which the signal changes within the fixed time window. In conjunction with FIG. 3B, a waveform change speed of the signal in the first time window W1 is greater than a waveform change speed of the signal in the second time window W2, that is, the switching rate of the signal in the first time window W1 is greater than the switching rate of the signal in the second time window W2. For instance, the switching rate of the signal is relevant to a turnover speed of transistors in the electronic system. The turnover speed of the transistors is faster, the change speed of the signal is faster.

FIG. 3A shows an example of adopting a quantity of electric charges (namely amplitude) to represent information. In a binary full-amplitude digital circuit, as shown in FIG. 3A, the quantity of electric charges is adopted to represent the information, and one bit can only represent two states "1" or "0". For instance, a large amount of charges (namely high voltage) represents "1", and a small amount of charges (namely low voltage) represents "0". However, in the information representation method provided by the embodiment of the present disclosure, the amplitude of the voltage (or the current) of the signal is no longer the focus of attention. Therefore, with the advancement of the process, the reduction of the supply voltage will not be the main factor affecting the fidelity of the information. The information representation method provided by the embodiment of the present disclosure is consistent with the development trend of the semiconductor process: the smaller the line width, the faster the turnover speed of the transistor, and the more effective the information representation method provided by the embodiment of the present disclosure.

The information representation method provided by the embodiment of the present disclosure has, but is not limited to, the following advantages. First, compared with a traditional digital circuit, the amplitude of the signal representing the information here can be greatly reduced, helping to greatly reduce the power consumption. As shown in FIG. 3A, in the binary full-amplitude digital circuit, because the quantity of electric charges is used to represent the information, the amplitude of the voltage signal needs to reach a power supply voltage VDD and a ground voltage VSS, to distinguish a high level and a low level. However, in the embodiment of the present disclosure, in conjunction with FIGS. 3B-3D, the amplitude of the voltage signal does need to reach the power supply voltage VDD and the ground voltage VSS (because it only needs to judge whether the voltage signal crosses the threshold voltage range or the threshold current range), thereby helping to reduce the power consumption. The second advantage is multi-ary system. In the traditional digital circuit, one bit can only represent two states. But in the embodiment of the present disclosure, one switching rate bit can contain a plurality of states, making it possible to directly adopting multi-ary system to perform operations in a computer, thereby greatly improving the computational efficiency of the computer.

Figure 2A:
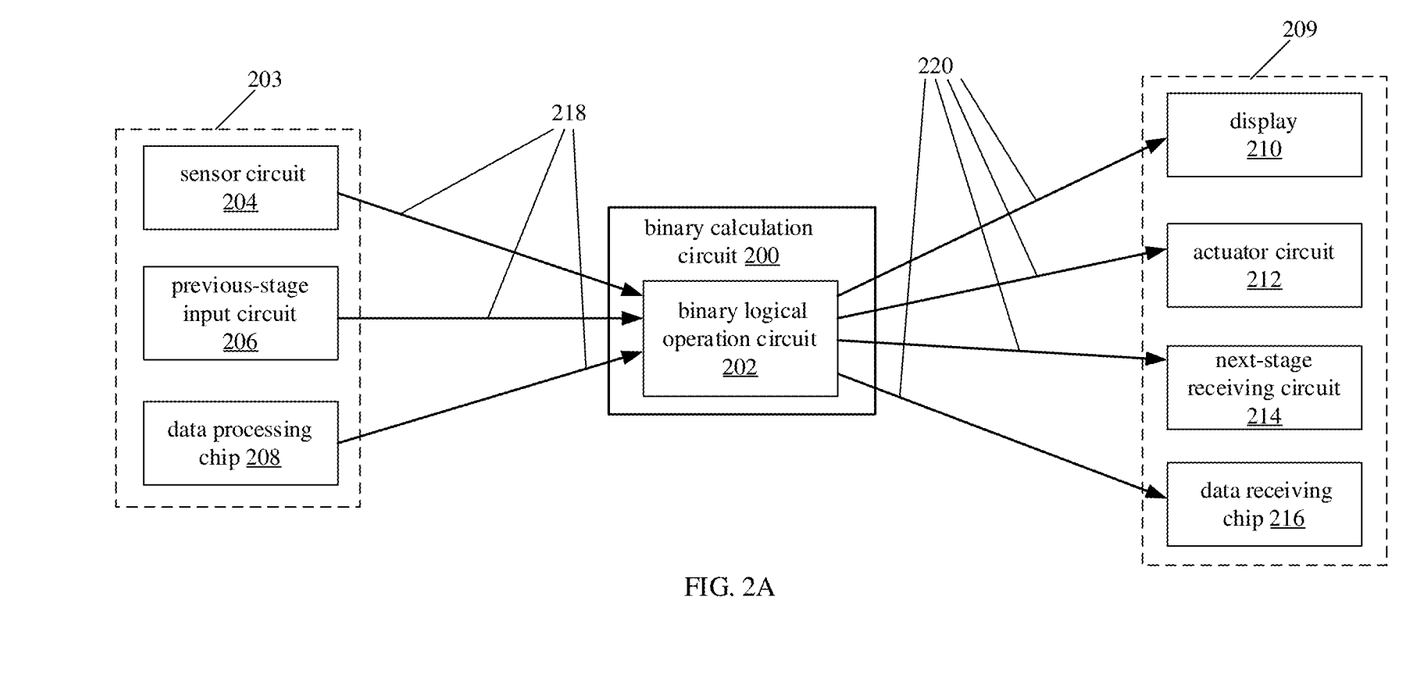
FIG. 2A is a schematic block diagram of an electronic system comprising a binary calculation circuit.

FIG. 2A is a schematic block diagram of an electronic system comprising a binary calculation circuit 200. The electronic system comprises an input circuit group 203, the binary calculation circuit 200 and an output circuit group 209.

The input circuit group 203 includes one or more data input modes. For instance, as shown in FIG. 2A, a sensor circuit 204, a previous-stage input circuit 206 and a data processing chip 208 are three specific examples of the data input modes. Each data input mode provides an input signal 218 to the binary calculation circuit 200. An amplitude of the input signal 218 is adopted to represent first information. The first information is input information. For instance, the amplitude of the input signal 218 carries the input information. Moreover, for instance, the input signal 218 is a binary signal, and high and low amplitudes of the input signal 218 respectively represent information "1" and "0" (as shown in FIG. 3A, the high voltage amplitude indicates the value of the information "1" and the low voltage amplitude indicates the value of the information "0").

For instance, the sensor circuit 204 includes an infrared sensor, a temperature sensor, an acoustic control sensor or any other types of sensors. The previous-stage input circuit 206 may include but is not limited to an image acquisition device (e.g., a camera), a sound acquisition device (e.g., a microphone) or other circuits that input data. The data processing chip 208 may include, for example, a chip for processing data such as a filter, an analog-to-digital converter and an amplifier.

The binary logical operation circuit 202 is configured to: receive input signals from respective data input circuits; and perform a binary logical operation according to the input signals, and take a result of the binary logical operation as an output signal 220. The amplitude of the output signal 220 is adopted to represent second information. The second information is output information. For instance, the amplitude of the output signal 220 carries the output information. Moreover, for instance, the output signal 220 is a binary signal, and high and low amplitudes of the output signal 220 respectively represent the information "1" and "0".

The output circuit group 209 includes one or more data receiving modes. For instance, a display 210, an actuator circuit 212, a next-stage receiving circuit 214 and a data receiving chip 216 are specific examples of four different data receiving modes. The data receiving modes receive the output signal 220 from the binary calculation circuit 200 and perform corresponding operations.

For instance, the display 210 may be a liquid crystal display (LCD), an organic light-emitting diode (OLED) display or other types of displays. The actuator circuit 212 may include a drive motor such as a motor or other actuator devices. The next-stage receiving circuit 214 may include a sound card, a display card or other circuits for receiving data. The data receiving chip 216, for instance, may be a buffer, a register or other circuits for receiving data.

The previous-stage input circuit 206, the binary logical operation circuit 202 and the next-stage receiving circuit 214 may be integrated into the same chip; the previous-stage input circuit 206 is a previous stage circuit of the binary logical operation circuit 202, and the next-stage receiving circuit 214 is a next stage circuit of the binary logical operation circuit 202.

Figure 2B:
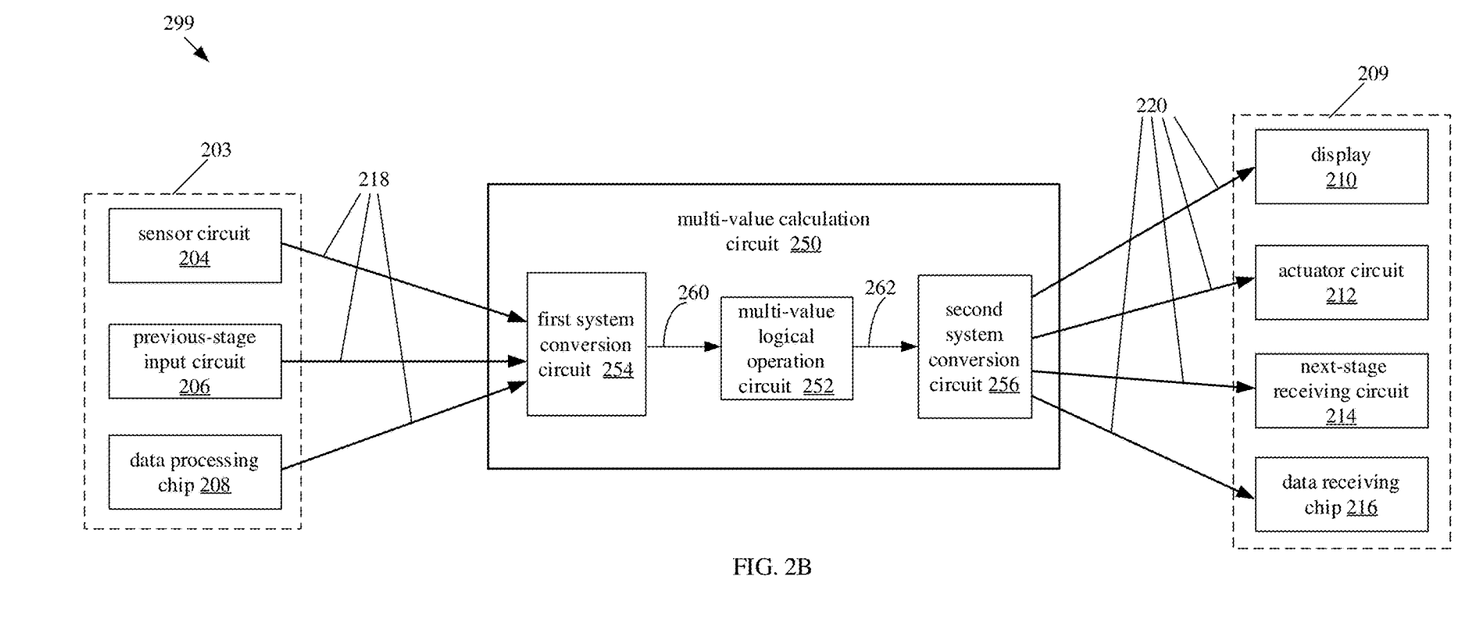
FIG. 2B is a schematic block diagram of an electronic system comprising a multi-value calculation circuit according to an embodiment of the present disclosure.

As shown in FIG. 2B, an embodiment of the present disclosure further provides a multi-value calculation circuit 250, which comprises:

a first system conversion circuit 254 configured to: receive an input signal 218, an amplitude of the input signal 218 being used to represent first information, and convert the input signal 218 into a first multi-value signal 260, a switching rate of the first multi-value signal 260 being used to represent the first information;

a multi-value logical operation circuit 252 configured to: receive the first multi-value signal 260 from the first system conversion circuit 254, and perform a multi-value logical operation according to the first multi-value signal 260, and output a second multi-value signal 262 as a result of the multi-value logical operation, the switching rate of the second multi-value signal 262 being used to represent the second information; and a second system conversion circuit 256 configured to: receive the second multi-value signal 262 from the multi-value logical operation circuit 252, and convert the second multi-value signal 262 into an output signal 220, an amplitude of the output signal 220 being used to represent the second information.

For instance, the first system conversion circuit 254, the multi-value logical operation circuit 252 and the second system conversion circuit 256 may be dedicated circuits and may be respectively designed to be independent chips or integrated into the same chip. For instance, the first system conversion circuit 254, the multi-value logical operation circuit 252 and the second system conversion circuit 256 may be implemented by using a transistor or a field programmable gate array (FPGA) (or an application-specific integrated circuit (ASIC)). No limitation will be given here in the present disclosure.

For instance, both the input signal 218 and the output signal 220 are binary data signals.

For instance, the first information includes input information of the multi-value calculation circuit 250, and the second information includes output information of the multi-value calculation circuit 250.

For instance, both the first information and the second information are represented as a switching-rate bit, a value range of the switching-rate bit includes N switching-rate states, and N is a positive integer and N>1.

For instance, a value of the first information and a value of the second information are respectively a first numerical value and a second numerical value of the switching-rate bit; the first numerical value of the switching-rate bit represents one state among the N switching-rate states; and the second numerical value of the switching-rate bit also represents one state among the N switching-rate states. For instance, the state represented by the first numerical value of the switching-rate bit and the state represented by the second numerical value of the switching-rate bit may be same or different, and the present disclosure is not limited thereto.

For instance, the first numerical value of the switching-rate bit is an N-ary number, and the second numerical value of the switching-rate bit is also an N-ary number.

In some embodiments, the first numerical value of the switching-rate bit is a number of times of the first multi-value signal crossing a threshold within the fixed time window, and the second numerical value of the switching-rate bit is a number of times of the second multi-value signal crossing the threshold within the fixed time window.

For instance, the first multi-value signal and the second multi-value signal are respectively a first voltage signal and a second voltage signal; the threshold is a threshold voltage; a value of the first information is a number of times of the first voltage signal crossing the threshold voltage within the fixed time window; and a value of the second information is a number of times of the second voltage signal crossing the threshold voltage within the fixed time window.

Or moreover, for example, the first multi-value signal and the second multi-value signal are respectively a first current signal and a second current signal; the threshold is a threshold current; a value of the first information is a number of times of the first current signal crossing the threshold current within the fixed time window; and a value of the second information is a number of times of the second current signal crossing the threshold current within the fixed time window.

For instance, in some embodiments, the first numerical value of the switching-rate bit is one of a number of times of the first multi-value signal entering the threshold range within the fixed time window, a number of times of the first multi-value signal leaving the threshold range within the fixed time window, and a sum of the number of times of the first multi-value signal entering the threshold range within the fixed time window and the number of times of the first multi-value signal leaving the threshold range within the fixed time window. The second numerical value of the switching-rate bit is one of a number of times of the second multi-value signal entering the threshold range within the fixed time window, a number of times of the second multi-value signal leaving the threshold range within the fixed time window, and a sum of the number of times of the second multi-value signal entering the threshold range within the fixed time window and the number of times of the second multi-value signal leaving the threshold range within the fixed time window.

For instance, the first multi-value signal and the second multi-value signal are respectively a first voltage signal and a second voltage signal, and the threshold range is a threshold voltage range. The value of the first information is one of a number of times of the first voltage signal entering the threshold voltage range within the fixed time window, a number of times of the first voltage signal leaving the threshold voltage range within the fixed time window, and a sum of the number of times of the first voltage signal entering the threshold voltage range within the fixed time window and the number of times of the first voltage signal leaving the threshold voltage range within the fixed time window. The value of the second information is a number of times of the second voltage signal entering the threshold voltage range within the fixed time window, a number of times of the second voltage signal leaving the threshold voltage range within the fixed time window, and a sum of the number of times of the second voltage signal entering the threshold voltage range within the fixed time window and the number of times of the second voltage signal leaving the threshold voltage range within the fixed time window.

Or moreover, for example, the first multi-value signal and the second multi-value signal are respectively a first current signal and a second current signal, and the threshold range is a threshold current range. The value of the first information is a number of times of the first current signal entering the threshold current range within the fixed time window, a number of times of the first current signal leaving the threshold current range within the fixed time window, and a sum of the number of times of the first current signal entering the threshold current range within the fixed time window and the number of times of the first current signal leaving the threshold current range within the fixed time window. The value of the second information is one of a number of times of the second current signal entering the threshold current range within the fixed time window, a number of times of the second current signal leaving the threshold current range within the fixed time window, and a sum of the number of times of the second current signal entering the threshold current range within the fixed time window and the number of times of the second current signal leaving the threshold current range within the fixed time window.

The description on the multi-value calculation circuit 250 may also refer to relevant descriptions in the embodiment of the above information representation method 100, and the repeated description is not repeated here.

For instance, as shown in FIG. 2B, an embodiment of the present disclosure further provides an electronic system 299, which comprises the multi-value calculation circuit 250 described in any one of the above embodiments.

For instance, the electronic system 299 further comprises: one or more data input modes configured to provide the input signal 218; and one or more data receiving modes configured to receive the output signal 220.

For instance, the electronic system 299 comprises an input circuit group 203 and an output circuit group 209. The input circuit group 203 includes one or more data input modes. For instance, a sensor circuit 204, a previous-stage input circuit 206 and a data processing chip 208 are three specific examples of the data input modes. A display 210, an actuator circuit 212, a next-stage receiving circuit 214 and a data receiving chip 216 are specific examples of four different data receiving modes. The similarities between FIGS. 2A and 2B are not repeated here.

For instance, the previous-stage input circuit 206, the multi-value calculation circuit 250 and the next-stage receiving circuit 214 may be integrated into the same chip; the previous-stage input circuit 206 is a previous stage circuit of the multi-value calculation circuit 250; and the next-stage receiving circuit 214 is a next stage circuit of the multi-value calculation circuit 250.

The description on the electronic system may refer to relevant descriptions in the embodiment of the above information representation method 100 and the embodiment of the multi-value calculation circuit 250, and the repeated description is not repeated here.

Compared FIG. 2A with FIG. 2B, in FIG. 2A, in the data processing and operating process, all the data signals are binary data signals and have low computational efficiency. In FIG. 2B, the input signal 218 is a binary data signal and is converted into the first multi-value signal 260 through the first system conversion circuit 254; the multi-value logical operation circuit 252 directly performs a multi-value logical operation on the first multi-value signal 260 and outputs the second multi-value signal 262; and the second system conversion circuit 256 converts the second multi-value signal 262 into the output signal 220 of the binary data and provides the output signal 220 to the data receiving modes. By adoption of the first system conversion from the binary data to the multi-value data and the second system conversion from the multi-value data to the binary data, the multi-value calculation circuit provided by the embodiment of the present disclosure can directly adopt multi-ary system for computing, which not only greatly improves the computational efficiency of the computer but also can be compatible with the existing data input modes and data receiving modes.

In the embodiment of the present disclosure, the multi-value calculation circuit 250 (including the first system conversion circuit 254, the multi-value logical operation circuit 252 and the second system conversion circuit 256) can be implemented by using dedicated hardware (e.g., a dedicated chip or an integrated circuit, etc.).

Of course, partial or all the functions of the multi-value calculation circuit 250 (comprising the first system conversion circuit 254, the multi-value logical operation circuit 252 and the second system conversion circuit 256) may also be implemented by software or by a combination of software and hardware. No limitation will be given here in the present disclosure. For instance, the multi-value calculation circuit 250 may be a circuit board or a combination of a plurality of circuit boards. The circuit board or the combination of the plurality of circuit boards may include: (1) one or more processors; (2) one or more non-transitory computer readable memories connected with the processors; and (3) processor-executable firmware stored in the memories.

The processor can process data signals and may include various kinds of computation architectures, e.g., a complex instruction set computer (CISC) architecture, a reduced instruction set computer (RISC) architecture, or an architecture that implements a combination of multiple instruction sets. In some embodiments, the processor may also be a microprocessor such as an X86 processor or an ARM processor, and may also be a digital signal processor (DSP) and the like. The processor can control other components in the electronic system to execute desired functions.

The memory can store instructions and/or data executed by the processor. For example, the memory may comprise one or more computer program products. The computer program products may comprise various forms of computer-readable storage media, such as volatile memory and/or non-volatile memory. The volatile memory may comprise, for example, a random access memory (RAM) and/or a cache or the like. The non-volatile memory may comprise, for example, a read only memory (ROM), a hard disk, a flash memory, and the like. One or more computer program instructions may be stored on the computer-readable storage medium and the processor may execute the program instructions to implement the information representation provided by the embodiments of the present disclosure and/or other desired functions. Various applications, various data such as various data used and/or generated by the applications, and the like, may also be stored in the computer-readable storage medium.

An embodiment of the present disclosure further provides a computer readable storage medium. Computer instructions are stored on the computer readable storage medium. When the computer instructions are executed by a processor, the operations of the information representation method 100 as shown in FIG. 1 are performed. For instance, the above memory is one of the computer readable storage medium.

In summary, in the information representation method, the multi-value calculation circuit and the electronic system provided by the embodiments of the present disclosure, the amplitude of the signal representing the information can be greatly reduced, which helps to greatly reduce the power consumption. Due to the use of multi-ary system, one switching-rate bit can contain a plurality of states, making it possible to directly adopt multi-ary system to perform operations in a computer, thereby greatly improving the computational efficiency of the computer.

In the present disclosure, relational terms such as first and second are used merely to distinguish one entity or operation from another entity or operation, and do not necessarily require or imply any such actual relationship or order between these entities or operations. Moreover, the terms "comprise", "include" or any other variation thereof are intended to encompass a non-exclusive inclusion, such that a process, a method, an item or a device that comprises a plurality of elements includes not only those elements but also includes other elements that are not explicitly listed, or includes elements that are inherent to such process, method, item or device. Without further limitations, an element defined by the phrase "comprising a . . . " does not exclude the existence of additional identical elements in the process, method, item or device including the element.

Obviously, various changes and modifications can be made by the skilled in the art to the present disclosure, without departing from the spirits and the scope of the present disclosure. Therefore, so far as these changes and modifications fall in the scope of the claims and their equivalents of the present disclosure, the present disclosure shall also intend to cover such changes and modifications.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. An information representation method of an electronic system, comprising:

acquiring a switching rate of a signal; and
adopting the switching rate of the signal to represent information;
wherein the information is represented as a switching-rate bit, a value of the information is equal to a value of the switching-rate bit, and the value of the switching-rate bit is a number of times the signal crossing a threshold within a fixed time window.

2. The information representation method according to claim 1, wherein a value range of the switching-rate bit comprises N switching-rate states, where N is a positive integer and N>1.

3. The information representation method according to claim 2, wherein the value of the information represents one of the N switching-rate states.

4. The information representation method according to claim 3, wherein the value of the switching-rate bit is an N-ary number.

5. The information representation method according to claim 1, wherein the signal is a voltage signal, the threshold is a threshold voltage, and
adopting the switching rate of the signal to represent the information comprises: adopting a number of times the voltage signal crossing the threshold voltage within the fixed time window to represent the value of the information; or
the signal is a current signal, the threshold is a threshold current, and
adopting the switching rate of the signal to represent the information comprises: adopting a number of times the current signal crossing the threshold current within the fixed time window to represent the value of the information.

6. The information representation method according to claim 1, wherein the switching rate of the signal represents a speed at which the signal changes within a fixed time window.

7. The information representation method according to claim 6, wherein the switching rate of the signal is relevant to a turnover speed of transistors in the electronic system.

8. A multi-value calculation circuit, comprising:
a first system conversion circuit configured to:
receive an input signal, an amplitude of the input signal being used to represent first information, and
convert the input signal into a first multi-value signal, a switching rate of the first multi-value signal being used to represent the first information;
a multi-value logical operation circuit configured to:
receive the first multi-value signal from the first system conversion circuit, and
perform a multi-value logical operation according to the first multi-value signal, and output a second multi-value signal as a result of the multi-value logical operation, a switching rate of the second multi-value signal being used to represent second information; and
a second system conversion circuit configured to:
receive the second multi-value signal from the multi-value logical operation circuit, and
convert the second multi-value signal into an output signal, an amplitude of the output signal being used to represent the second information.

9. The multi-value calculation circuit according to claim 8, wherein the first information comprises input information of the multi-value calculation circuit, and the second information comprises output information of the multi-value calculation circuit.

10. The multi-value calculation circuit according to claim 8, wherein both the first information and the second information are represented as a switching-rate bit, a value range of the switching-rate bit comprises N switching-rate states, and N is a positive integer and N>1.

11. The multi-value calculation circuit according to claim 8, wherein a value of the first information and a value of the second information are respectively a first numerical value and a second numerical value of the switching-rate bit, the first numerical value of the switching-rate bit represents one state among the N switching-rate states, and the second numerical value of the switching-rate bit also represents one state among the N switching-rate states.

12. The multi-value calculation circuit according to claim 11, wherein the first numerical value of the switching-rate bit is a number of times the first multi-value signal crossing a threshold within a fixed time window, and the second numerical value of the switching-rate bit is a number of times the second multi-value signal crossing the threshold within the fixed time window.

13. The multi-value calculation circuit according to claim 12, wherein
the first multi-value signal and the second multi-value signal are respectively a first voltage signal and a second voltage signal, the threshold is a threshold voltage, a value of the first information is a number of times the first voltage signal crossing the threshold voltage within the fixed time window, and a value of the second information is a number of times the second voltage signal crossing the threshold voltage within the fixed time window; or
the first multi-value signal and the second multi-value signal are respectively a first current signal and a second current signal, the threshold is a threshold current, a value of the first information is a number of times the first current signal crossing the threshold current within the fixed time window, and a value of the second information is a number of times the second current signal crossing the threshold current within the fixed time window.

14. The multi-value calculation circuit according to claim 11, wherein
the first numerical value of the switching-rate bit is one of a number of times the first multi-value signal entering a threshold range within a fixed time window, a number of times the first multi-value signal leaving the threshold range within the fixed time window, and a sum of the number of times the first multi-value signal entering the threshold range within the fixed time window and the number of times the first multi-value signal leaving the threshold range within the fixed time window; and
the second numerical value of the switching-rate bit is one of a number of times the second multi-value signal entering the threshold range within the fixed time window, a number of times the second multi-value signal leaving the threshold range within the fixed time window, and a sum of the number of times the second multi-value signal entering the threshold range within the fixed time window and the number of times the second multi-value signal leaving the threshold range within the fixed time window.

15. The multi-value calculation circuit according to claim 14, wherein
the first multi-value signal and the second multi-value signal are respectively a first voltage signal and a second voltage signal, the threshold range is a threshold voltage range, the value of the first information is one of a number of times the first voltage signal entering the threshold voltage range within the fixed time window, a number of times the first voltage signal leaving the threshold voltage range within the fixed time window, and a sum of the number of times the first voltage signal entering the threshold voltage range within the fixed time window and the number of times the first voltage signal leaving the threshold voltage range within the fixed time window; and the value of the second information is one of a number of times the second voltage signal entering the threshold voltage range within the fixed time window, a number of times the second voltage signal leaving the threshold voltage range within the fixed time window, and a sum of the number of times the second voltage signal entering the threshold voltage range within the fixed time window and the number of times the second voltage signal leaving the threshold voltage range within the fixed time window; or the first multi-value signal and the second multi-value signal are respectively a first current signal and a second current signal, the threshold range is a threshold current range;

the value of the first information is one of a number of times the first current signal entering the threshold current range within the fixed time window, the number of times the first current signal leaving the threshold current range within the fixed time window, and a sum of the number of times the first current signal entering the threshold current range within the fixed time window and the number of times the first current signal leaving the threshold current range within the fixed time window; and the value of the second information is one of a number of times the second current signal entering the threshold current range within the fixed time window, the number of times the second current signal leaving the threshold current range within the fixed time window, and a sum of the number of times the second current signal entering the threshold current range within the fixed time window and the number of times the second current signal leaving the threshold current range within the fixed time window.

16. An electronic system, comprising the multi-value calculation circuit according to claim 8.

17. The electronic system according to claim 16, further comprising:
one or more data input modes configured to provide the input signal; and
one or more data receiving modes configured to receive the output signal.

18. An information representation method of an electronic system, comprising:
acquiring a switching rate of a signal; and
adopting the switching rate of the signal to represent information;
wherein the information is represented as a switching-rate bit, a value of the information is equal to a value of the switching-rate bit, and the value of the switching-rate bit is one of a number of times the signal entering a threshold range within a fixed time window, a number of times the signal leaving the threshold range within the fixed time window, and a sum of the number of times the signal entering the threshold range within the fixed time window and the number of times the signal leaving the threshold range within the fixed time window.

19. The information representation method according to claim 18, wherein the signal is a voltage signal, the threshold range is a threshold voltage range, and
adopting the switching rate of the signal to represent the information comprises: adopting the number of times the voltage signal entering and/or leaving the threshold voltage range within the fixed time window to represent the value of the information; or
the signal is a current signal, the threshold range is a threshold current range, and
adopting the switching rate of the signal to represent the information comprises: adopting the number of times the current signal entering and/or leaving the threshold current range within the fixed time window to represent the value of the information.

\* \* \* \* \*